(12) United States Patent
Matsumoto

(10) Patent No.: US 11,053,594 B2
(45) Date of Patent: Jul. 6, 2021

(54) MICROETCHANT FOR COPPER AND METHOD FOR PRODUCING WIRING BOARD

(71) Applicant: MEC COMPANY LTD., Hyogo (JP)

(72) Inventor: Keisuke Matsumoto, Hyogo (JP)

(73) Assignee: MEC COMPANY LTD., Hyogo (JP)

( * ) Notice: Subject to any disclaimer, the term of this patent is extended or adjusted under 35 U.S.C. 154(b) by 0 days.

(21) Appl. No.: 16/736,154

(22) Filed: Jan. 7, 2020

(65) Prior Publication Data

US 2020/0141010 A1    May 7, 2020

Related U.S. Application Data

(63) Continuation of application No. 16/067,665, filed as application No. PCT/JP2017/004653 on Feb. 8, 2017, now abandoned.

(30) Foreign Application Priority Data

Feb. 19, 2016  (JP) .................... 2016-030276
Jan. 26, 2017  (JP) .................... 2017-011841

(51) Int. Cl.
C09K 13/00    (2006.01)
C23F 1/18     (2006.01)
H05K 3/38     (2006.01)
H01L 21/3213  (2006.01)

(52) U.S. Cl.
CPC .......... *C23F 1/18* (2013.01); *H01L 21/32134* (2013.01); *H05K 3/383* (2013.01); *H05K 2203/0307* (2013.01); *H05K 2203/0776* (2013.01); *H05K 2203/0789* (2013.01)

(58) Field of Classification Search
None
See application file for complete search history.

(56) References Cited

U.S. PATENT DOCUMENTS

| | | | |
|---|---|---|---|
| 4,888,209 A | 12/1989 | Neely et al. | |
| 5,421,989 A | 6/1995 | Stamp et al. | |
| 5,439,783 A | 8/1995 | Akiyama et al. | |
| 5,496,590 A | 3/1996 | Maki et al. | |
| 5,788,830 A | 8/1998 | Sakamoto et al. | |
| 5,807,493 A | 9/1998 | Maki et al. | |
| 5,965,036 A | 10/1999 | Maki et al. | |
| 6,303,181 B1 | 10/2001 | Thorn et al. | |
| 9,006,383 B2 * | 4/2015 | Sato | C08G 75/00 528/382 |
| 9,011,712 B2 | 4/2015 | Kurii et al. | |
| 2002/0038790 A1 | 4/2002 | Kurii et al. | |
| 2005/0109734 A1 | 5/2005 | Kuriyama | |
| 2007/0051693 A1 | 3/2007 | Feng et al. | |
| 2007/0138142 A1 | 7/2007 | Feng et al. | |
| 2008/0264900 A1 | 10/2008 | Feng et al. | |
| 2009/0029186 A1 | 1/2009 | Matsunaga et al. | |
| 2012/0150673 A1 | 6/2012 | Hart et al. | |
| 2012/0156968 A1 * | 6/2012 | Kimura | B24B 37/044 451/36 |
| 2014/0091052 A1 | 4/2014 | Nagashima et al. | |
| 2014/0242798 A1 | 8/2014 | Izawa et al. | |
| 2014/0326696 A1 | 11/2014 | Kurii et al. | |
| 2015/0115196 A1 | 4/2015 | Kurii et al. | |
| 2017/0275498 A1 * | 9/2017 | Tamada | C09K 3/1463 |
| 2018/0043497 A1 | 2/2018 | Hanano et al. | |

FOREIGN PATENT DOCUMENTS

| | | |
|---|---|---|
| JP | 9-41162 | 2/1997 |
| JP | 9-41163 | 2/1997 |
| JP | 2002-47583 | 2/2002 |
| JP | 2004-256901 | 9/2004 |
| JP | 2006-28556 | 2/2006 |
| JP | 2006-299359 | 11/2006 |
| JP | 2009-506211 | 2/2009 |
| JP | 2009-167459 | 7/2009 |
| JP | 2010-525175 | 7/2010 |
| JP | 2010-537042 | 12/2010 |
| JP | 2011-17054 | 1/2011 |
| WO | 2007/024312 | 3/2007 |
| WO | 2010/071078 | 6/2010 |

OTHER PUBLICATIONS

International Search Report dated Apr. 18, 2017 in International Application No. PCT/JP2017/004653.
International Preliminary Report on Patentability dated Aug. 30, 2018 in International Application No. PCT/JP2017/004653.
Extended European Search Report dated Jan. 17, 2019 in corresponding European Patent Application No. 17753057.3.

* cited by examiner

*Primary Examiner* — Shamim Ahmed

(74) *Attorney, Agent, or Firm* — Wenderoth, Lind & Ponack, L.L.P.

(57) ABSTRACT

Disclosed are: a microetching agent which can form roughened shapes less affected by differences in the crystallinity of the copper and with which roughened shape excellent in terms of adhesiveness to resins, etc. can be formed on either electrolytic copper or rolled copper; and a method for producing a wiring board which includes a step of roughening a copper surface using the microetching agent. In the present invention, the microetching agent for copper is an acidic aqueous solution containing an inorganic acid, a cupric ion source, a halide ion source, and a polymer. The polymer has a functional group containing a nitrogen atom. It is preferable that the microetching agent contain a sulfate ion source.

20 Claims, 13 Drawing Sheets

MICROETCHANT FOR COPPER AND METHOD FOR PRODUCING WIRING BOARD

TECHNICAL FIELD

The invention relates to a microetching agent for copper and a method for producing a wiring board.

BACKGROUND ART

A multilayer wiring board in general is produced by laminating an inner layer substrate, which includes a conductive layer composed of copper, copper alloy or the like, to another inner layer substrate or a copper foil with a prepreg held therebetween. Conductive layers are electrically connected with each other by a copper plated through-hole. In order to enhance the adhesion between the conductive layers and the resin such as a prepreg or solder, fine irregularities are formed on the surface of the conductive layers by using a microetching agent (roughening agent). When a microetching agent is brought into contact with a metal surface, irregularities are formed to roughen the surface due to difference in the etching rate by the crystal orientation of the crystal grains of the metal, difference in the etching rate between the crystal grains and the crystal grain boundary part of the metal, and the like.

Organic acid-based microetching agents (See Patent Document 1), sulfuric acid-hydrogen peroxide-based microetching agents (See Patent Document 2), hydrochloric acid-based microetching agents (See Patent Document 3), and the like are known as the microetching agent for copper or copper alloy. For the purpose of adjusting roughened shape, etching rate etc., halogen, polymer, anticorrosive agent, surfactant, and the like are added to these microetching agents.

PRIOR ART DOCUMENTS

Patent Documents

Patent Document 1: JP 9-41163 A
Patent Document 2: JP 2002-47583 A
Patent Document 3: WO2007/024312

SUMMARY OF THE INVENTION

Problems to be Solved by the Invention

A rolled copper foil and an electrolytic copper foil are mainly used as conductive layers of a printed wiring board. As shown in FIGS. 1A and 1B, rolled copper and electrolytic copper have different microscopic surface shapes. In addition, crystal characteristics of the rolled copper and electrolytic copper are markedly different. For this reason, when the type of the copper foil is different, the roughened shape formed on the surface by the etching treatment may differ in some cases. In particular, the rolled copper foil has large crystal grains and has a high uniformity of crystal plane orientation, so that formation of irregularities tends to be uneasy. For this reason, with a conventional microetching agent, a proper roughened shape may not be formed, or roughening unevenness may be generated on the rolled copper foil in some cases, even though a roughened shape excellent in adhesion to resin can be formed uniformly on the surface of the electrolytic copper foil. In such a case, it is necessary to change the microetching agent in accordance with the type of the copper foil, thereby raising a problem such as complication of process management.

In view of the above, an object of the present invention is to provide a microetching agent that can form a roughened shape less affected by difference in the crystallinity of copper and with which a roughened shape excellent in terms of adhesion to resin or the like can be formed on each of rolled copper and electrolytic copper.

Means for Solving the Problems

The present invention relates to a microetching agent for copper that is used for surface roughening of the copper. The term "copper" in the present specification is meant to include copper and copper alloy. The term "copper layer" is meant to include a copper wiring pattern layer as well. The microetching agent is an acidic aqueous solution containing an inorganic acid, a cupric ion source, a halide ion source, a sulfate ion source, and a polymer. The polymer contained in the microetching agent is a water-soluble polymer having a weight-average molecular weight of 1000 or more and having an amino group or a quaternary ammonium group in the side chain. The polymer is preferably cationic.

Furthermore, the present invention relates to a method for producing a wiring board including a copper layer. The production method of a wiring board includes a step of roughening the surface of a copper layer by bringing the aforementioned microetching agent into contact with the surface of the copper layer (roughening treatment step). In the roughening treatment step, it is preferable to add a replenishing liquid to the microetching agent in order to keep the composition of the microetching agent within a predetermined range.

Effects of the Invention

According to the present invention, a roughened shape excellent in adhesion to resin or the like can be formed uniformly even on rolled copper.

MODE FOR CARRYING OUT THE INVENTION

[Composition of Microetching Agent]

Figure 1A:
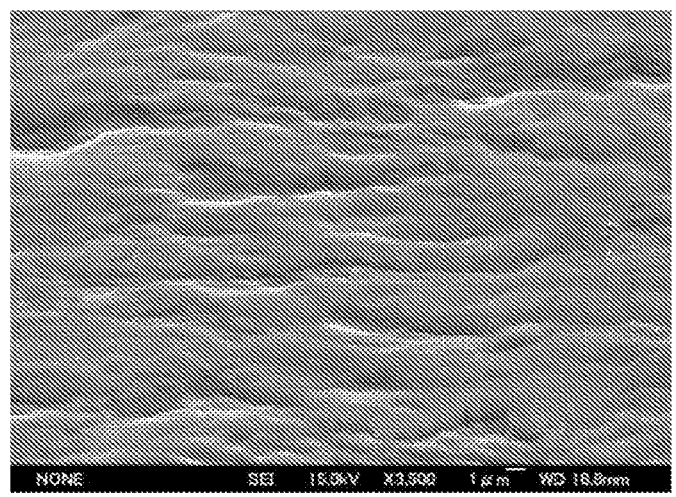
FIG. 1A is a scanning electron microscope photograph (photographing angle: 45°, magnification: 3500) of a rolled copper surface that has not been subjected to an etching treatment.

The microetching agent of the present invention is used for forming a roughened shape on the surface of copper. The microetching agent is an acidic aqueous solution containing an inorganic acid, a cupric ion source, a halide ion source, a sulfate ion source, and a polymer. Components contained in the microetching agent of the present invention will be described below.

<Cupric Ion>

A cupric ion source generates a cupric ion in an aqueous solution. The cupric ion acts as an oxidant for oxidizing copper. Examples of the cupric ion source include copper halides such as cupric chloride and cupric bromide; inorganic acid salts such as cupric sulfate and cupric nitrate; organic acid salts such as cupric formate and cupric acetate; cupric hydroxide; and cupric oxide. Cupric halide can be used as a compound having both functions of halide ion source and the cupric ion source because the cupric halide generates a cupric ion and a halide ion in the aqueous solution. Cupric sulfate can be used as used as a compound having both functions of the sulfate ion source and the cupric ion source because the cupric sulfate generates a cupric ion as well as a sulfate ion and a hydrogensulfate ion in the aqueous solution. The cupric ion sources may be used in combination of two or more thereof.

Enhancing the concentration of the cupric ion source properly maintains the etching rate and can form a uniform roughened shape over the entire surface even on a copper layer, such as rolled copper, having large crystal grains of copper and having a high uniformity of crystal plane orientation. The molar concentration of the cupric ion source is preferably 0.05 mol/L or more. It is to be noted that the molar concentration of the cupric ion source is a molar concentration of copper atoms contained in the cupric ion source and is equal to the concentration of the cupric ion in the etching agent. The molar concentration of the cupric ion source is preferably 3 mol/L or less from the viewpoint of suppressing excessive etching and maintaining the solubility of the copper ion when the copper ion concentration rises in accordance with the progress of etching. The molar concentration of the cupric ion source is more preferably 0.1 to 2 mol/L, further preferably 0.3 to 1.5 mol/L.

<Inorganic Acid>

The inorganic acid has a function of dissolving copper oxidized by a cupric ion, as well as a function of adjusting pH. Lowering the pH of the microetching agent enhances the solubility of oxidized copper and tends to suppress deposition of other components when the copper ion concentration in the liquid rises in accordance with the progress of etching. An inorganic acid is used as the acid from the viewpoint of keeping the pH of the microetching agent low. As the inorganic acid, a strong acid such as a hydrohalic acid such as hydrochloric acid or hydrobromic acid, sulfuric acid, or nitric acid is preferred. The hydrohalic acid can be used as a compound having both functions of the halide ion source and the acid. The sulfuric acid can be used as a compound having both functions of the sulfate ion source and the acid. For this reason, the microetching agent of the present invention preferably contains sulfuric acid and/or hydrohalic acid as the inorganic acid. Among the hydrohalic acids, hydrochloric acid (aqueous solution of hydrogen chloride) is preferable.

The acids may be used in combination of two or more thereof, and an organic acid may be used in addition to an inorganic acid. The pH of the microetching agent is preferably 3 or less, more preferably 2 or less, from the viewpoint of suppressing deposition of other components to enhance the stability of the etching agent when the cupric ion concentration rises. The concentration of the inorganic acid of the microetching agent is preferably adjusted so that the pH may fall within the aforementioned range.

<Halide Ion>

A halide ion source generates a halide ion in the aqueous solution. The halide ion has a function of aiding dissolution of copper to form a copper layer surface excellent in adhesion. Examples of the halide ion source may be ion sources of a chloride ion, a bromide ion and the like. Chloride ion is particularly preferred for uniformly forming a copper layer surface excellent in adhesion. Two or more kind of halide ion may be included in the microetching agent.

Examples of the halide ion source include hydrohalic acids such as hydrochloric acid and hydrobromic acid; and metal salts such as sodium chloride, calcium chloride, potassium chloride, ammonium chloride, potassium bromide, sodium bromide, copper chloride, copper bromide, zinc chloride, iron chloride and tin bromide. The halide ion sources may be used in combination of two or more thereof. As described before, the hydrohalic acid has functions of both the halide ion source and the acid, and copper halide has functions of both the halide ion source and the cupric ion source.

From the viewpoint of promoting formation of a roughened shape onto the surface of the copper layer, the concentration of the halide ion in the microetching agent, i.e., the concentration of the halide ion that is ionized in the etching agent, is preferably 0.01 mol/L or more, more preferably 0.05 mol/L or more, and further preferably 0.1 mol/L or more. Although the upper limit of the halide ion concentration is not particularly limited, the halide ion concentration is preferably 4 mol/L or less, more preferably 2 mol/L or less, from the viewpoint of solubility.

The molar concentration of the cupric ion source is preferably 0.2 times or more, more preferably 0.3 times or more, and further preferably 0.5 times or more, as large as the molar concentration of the halide ion source. By adjusting the concentration ratio of the cupric ion and the halogen, a uniform roughened shape excellent in adhesion to resin or the like can be formed on each of the electrolytic copper and the rolled copper. The molar concentration of the cupric ion source is preferably 10 times or less, more preferably 7 times or less, and further preferably 5 times or less, as large as the molar concentration of the halide ion source, from the viewpoint of obtaining compatibility between formation of the uniform roughened shape and solubility.

<Sulfate Ion Source>

A sulfate ion source generates a sulfate ion ($SO_4^{2-}$) and/or a hydrogensulfate ion ($HSO_4^-$) in the aqueous solution. Examples of the sulfate ion source include sulfates such as potassium sulfate, sodium sulfate, calcium sulfate, magnesium sulfate, cupric sulfate, ferric sulfate, and ammonium sulfate, sulfuric acid, and sodium hydrogensulfate. As described before, cupric sulfate has functions of both the sulfate ion source and the cupric ion source, and sulfuric acid has functions of both the sulfate ion source and the acid.

By presence of the sulfate ion or hydrogensulfate ion in the microetching agent in addition to the cupric ion, halide ion, and polymer, irregularities having a fine shape suitable for adhesion to resin or the like can be formed on the surface of copper. Further, by presence of the sulfate ion and hydrogensulfate ion, the pH of the liquid can be kept low to enhance the stability of the aqueous solution. The concentration of the sulfate ion source, i.e., a sum of the sulfate ion concentration and the hydrogensulfate ion concentration in the microetching agent, is preferably 0.02 mol/L or more. The concentration of the sulfate ion source is more preferably 0.05 to 5 mol/L, and further preferably 0.1 to 3 mol/L.

<Polymer>

The microetching agent of the present invention contains a water-soluble polymer having a weight-average molecular weight of 1000 or more and having an amino group or a quaternary ammonium group in a side chain. Together with the halide ion, the polymer has a function of forming a roughened shape having an excellent adhesion property. Fine irregularities can be formed uniformly on the surface of rolled copper by coexistence of the halide ion with the polymer having an amino group or a quaternary ammonium group in a side chain in the microetching agent. The weight-average molecular weight of the polymer is preferable 2000 or more, more preferably 5000 or more, from the viewpoint of forming the uniform roughened shape. The weight-average molecular weight of the polymer is preferably 5000000 or less, more preferably 2000000 or less, from the viewpoint of water solubility. The weight-average molecular weight is a value obtained in terms of polyethylene glycol by gel permeation chromatography (GPC) analysis.

The polymer having a quaternary ammonium group in a side chain may be, for example, a polymer having a repeating unit represented by the following formula (I).

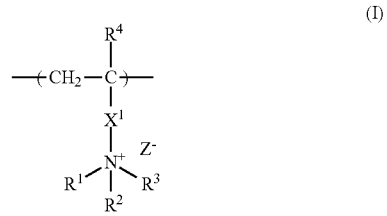

(I)

In the formula (I), $R^1$ to $R^3$ are each independently a chain or cyclic hydrocarbon group optionally having a substituent, where two or more of $R^1$ to $R^3$ may be bonded with each other to form a cyclic structure. $R^4$ is a hydrogen atom or methyl group; $X^1$ is a single bond or a divalent linking group; and $Z^-$ is a counter anion.

Specific examples of the polymer having a repeating unit represented by the formula (I) include a quaternary ammonium salt-type styrene polymer and a quaternary ammonium salt-type aminoalkyl (meth)acrylate polymer.

The polymer having a quaternary ammonium group in a side chain may be one having a repeating unit in which the carbon atoms in the main chain and the quaternary ammonium group in the side chain form a cyclic structure, as represented by the following formula (II).

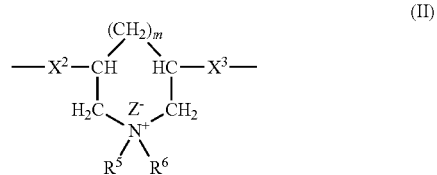

(II)

In the formula (II), each of $R^5$ and $R^6$ is a chain or cyclic hydrocarbon group optionally having a substituent, where $R^5$ and $R^6$ may be bonded with each other to form a cyclic structure. The numeral m is an integer of 0 to 2. $X^2$ and $X^3$ are each independently a single bond or a divalent linking group. Specific examples of the polymer having a repeating unit represented by the formula (II) include a quaternary ammonium salt-type diallylamine polymer obtained by polymerization of a diallyldialkylammonium salt represented by the formula (IIa).

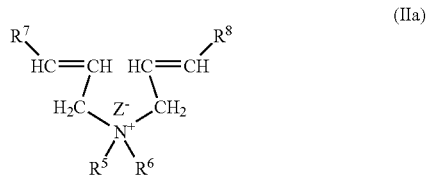

(IIa)

In the formula (IIa), $R^7$ and $R^8$ are each independently a hydrogen atom or a chain or cyclic hydrocarbon group optionally having a substituent, and are preferably a hydrogen atom.

The quaternary ammonium group in the side chain may have a double bond between the nitrogen atom and the carbon atom, and may contain the nitrogen atom of the quaternary ammonium group as a constituent atom of the ring. Further, two polymer chains may be cross-linked by the quaternary ammonium group as in the repeating unit represented by the following formula (III).

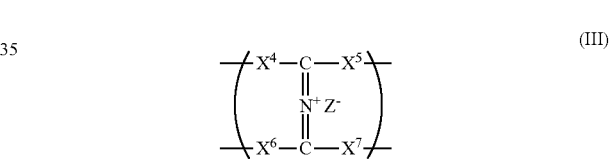

(III)

In the above formula (III), $X^4$ to $X^7$ are each independently a single bond or a divalent linking group.

Examples of the counter anion Z of the quaternary ammonium salt include $Cl^-$, $Br^-$, $I^-$, $ClO_4^-$, $BF_4^-$, $CH_3COO^-$, $PF^-$, $HSO_4^-$, and $C_2H_5SO_4^-$. When $X^1$ to $X^7$ are a divalent linking group, specific examples thereof include methylene group, alkylene group having a carbon number of 2 to 10, arylene group, —CONH—R— group, and —COO—R— group (where R is a single bond, methylene group, alkylene group having a carbon number of 2 to 10, or an ether group (alkyloxyalkyl group) having a carbon number of 2 to 10).

The polymer having an amino group in a side chain may be, for example, a polymer having a repeating unit represented by the following formula (IV).

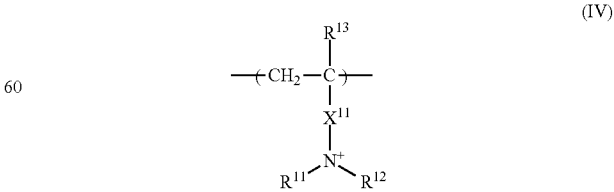

(IV)

In the formula (IV), $R^{11}$ and $R^{12}$ are each independently a hydrogen atom or a chain or cyclic hydrocarbon group optionally having a substituent, where $R^{11}$ and $R^{12}$ may be bonded with each other to form a cyclic structure. $R^{13}$ is a hydrogen atom or methyl group, and $X^{11}$ is a single bond or a divalent linking group. The amino group may be any of primary, secondary, and tertiary amino groups, and may form an ammonium salt. The counter anion of the ammonium salt may be, for example, one that has been described above as the counter anion $Z^-$ of the quaternary ammonium salt.

The polymer having an amino group in a side chain may be one having a repeating unit in which the carbon atoms in the main chain and the amino group in the side chain form a cyclic structure, as represented by the following formula (V).

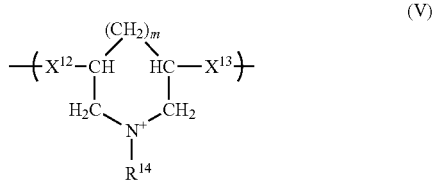

In the above formula (V), $R^{14}$ is a hydrogen atom or a chain or cyclic hydrocarbon group optionally having a substituent. The numeral m is an integer of 0 to 2. $X^{12}$ and $X^{13}$ are each independently a single bond or a divalent linking group. Specific examples of the polymer having a repeating unit represented by the formula (V) include a diallylamine polymer obtained by polymerization of diallylamine or a diallylamine salt.

When $X^{11}$ to $X^{13}$ in the above formulas (IV) and (V) are divalent linking group, specific examples thereof include one that has been described above as specific examples of $X^1$ to $X^7$.

The polymer having an amino group or a quaternary ammonium group in a side chain may be a copolymer. When the polymer is a copolymer, the copolymer may include a repeating unit that contains an amino group or a quaternary ammonium group and a repeating unit that contains neither an amino group nor a quaternary ammonium group. Sequence of the repeating units in the copolymer is not particularly limited. The copolymer may be any of an alternating copolymer, a block copolymer, and a random copolymer. When the copolymer is a block copolymer or a random copolymer, the ratio of the repeating units containing an amino group or a quaternary ammonium group relative to the monomer units of the whole polymer is preferably 20 mol % or more, more preferably 30 mol % or more, and further preferably 40 mol % or more.

The repeating unit contained in the copolymer may have neither an amino group nor a quaternary ammonium group. Example of the repeating unit include structures derived from (meth)acrylic acid, alkyl (meth)acrylate, aminoalkyl (meth)acrylate, styrene derivatives, sulfur dioxide, and the like. The polymer having a structure derived from a quaternary ammonium salt-type diallylamine represented by the above general formula (II) and the polymer having a structure derived from diallylamine represented by the above general formula (IV) preferably has a structure unit derived from sulfur dioxide represented by the following formula as a repeating unit of the copolymer.

The polymer may have both of an amino group and a quaternary ammonium group in a side chain. The polymers may be used in combination of two or more thereof, where a polymer having an amino group in a side chain and a polymer having a quaternary ammonium group in a side chain may be used in combination.

The concentration of the aforementioned polymer in the microetching agent is preferably 0.002 to 2 g/L, more preferably 0.005 to 1 g/L, further preferably 0.008 to 0.5 g/L, and most preferably 0.01 to 0.2 g/L, from the viewpoint of forming a copper layer surface excellent in adhesion. The content of the cupric ion in the microetching agent is preferably 50 to 20000 times, more preferably 100 to 10000 times, and further preferably 200 to 6000 times, as large as that of the aforementioned polymer in terms of weight ratio.

<Other Additives>

The microetching agent of the present invention can be easily prepared by dissolving the aforementioned components in ion-exchanged water or the like. The microetching agent may contain components other than those described above. For example, a nonionic surfactant as an antifoaming agent may be added and a complexing agent such as pyridine may be added for improving dissolving stability of copper. In addition, various additives may be added as required. When these additives are added, the concentration of the additives in the microetching agent is about 0.0001 to 20% by weight.

When hydrogen peroxide is contained in the microetching agent, dissolution of copper by the oxidation power of the hydrogen peroxide proceeds, which may inhibit formation of the roughened shape on the copper layer having large crystal grains and high uniformity of the crystal plane orientation, such as the rolled copper. In addition, the microetching agent free from hydrogen peroxide has advantages such that the concentration control of the solution and the effluent disposal are simplified. For this reason, the concentration of hydrogen peroxide in the microetching agent is most preferably zero. On the other hand, a trace amount of hydrogen peroxide that may be contained in the raw material etc. is permissible. The concentration of hydrogen peroxide in the microetching agent is preferably 0.1% by weight or less, more preferably 0.01% by weight or less.

[Usage of Microetching Agent]

The microetching agent of the present invention can be widely used for roughening a copper layer surface, and so on. Irregularities are formed uniformly on the treated copper surface, leading to satisfactory adhesion to resins of a prepreg, a plating resist, an etching resist, a solder resist, an electrodeposition resist, a coverlay and the like. The microetching agent also provides a surface excellent in solderability, and is therefore particularly useful for production of various wiring boards including those for pin grid array (PGA) and those for ball grid array (BGA). It is also useful for surface treatment of a lead frame.

In the microetching agent of the present invention, difference in the roughened shape caused by difference in the crystallinity of copper is small, so that a roughened shape excellent in adhesion to resin or the like can be formed both on the electrolytic copper and on the rolled copper. For this reason, even when a copper foil serving as an object of treatment is different, there is no need to change the etching agent, and the same etching agent can be repetitively used.

[Wiring Board Production Method]

In the production of a wiring board, the aforementioned microetching agent is brought into contact with the surface of a copper layer to roughen the surface thereof. In producing a wiring board having a plurality of copper layers, one layer among the plurality of copper layers may be treated with the aforementioned microetching agent, or alternatively, two or more of the copper layers may be treated with the aforementioned microetching agent. Whereas a conventional microetching agent is used mainly for surface roughening of electrolytic copper foil, the aforementioned microetching agent can form a roughened shape uniformly on the surface of each of electrolytic copper and rolled copper. Accordingly, the microetching agent of the present invention can be suitably used also for roughening of the copper layer in which the surface to be treated (surface that is brought into contact with the microetching agent) is made of rolled copper.

In the roughening treatment, the method for bringing the microetching agent into contact with the surface of the copper layer is not particularly limited, and examples thereof include a method in which a microetching agent is sprayed to the surface of a copper layer to be treated and a method in which a copper layer to be treated is dipped in a microetching agent. When the microetching agent is sprayed, it is preferred to perform etching at a microetching agent temperature of 10 to 40° C. and a spray pressure of 0.03 to 0.3 MPa for 5 to 120 seconds. When the copper layer is dipped, it is preferred to perform etching at a microetching agent temperature of 10 to 40° C. for 5 to 120 seconds. Furthermore, when the copper layer is dipped in a microetching agent, it is preferred to blow air into the microetching agent by bubbling or the like so that a cuprous ion generated in the microetching agent by etching of copper is oxidized to a cupric ion. When the microetching agent is substantially free from hydrogen peroxide, an effluent disposal of the microetching agent after use is easy, and the disposal treatment can be performed by a general simple method using, for example, a neutralizer, a polymer coagulant or the like.

The etching amount in the roughening treatment is not particularly limited. From the viewpoint of forming the irregularities uniformly on copper surface irrespective of the crystallinity of copper, the etching amount is preferably 0.05 µm or more, more preferably 0.1 µm or more. When the etching amount is excessively large, an inconvenience such as electrical disconnection caused by complete etching of the copper layer or increase in the electrical resistance caused by decrease in the wiring cross-sectional area may be generated. For this reason, the etching amount is preferably 5 µm or less, more preferably 3 µm or less. The "etching amount" refers to an average etching amount (dissolved amount) in the depth direction, and is calculated from a weight and a specific gravity of copper dissolved by a microetching agent, and a front projection area of the copper surface.

It is preferred to wash the roughened copper layer surface with an acidic aqueous solution for removing generated smut after the roughening treatment. As the acidic aqueous solution to be used for washing, hydrochloric acid, an aqueous sulfuric solution, a nitric acid aqueous solution and the like can be used. Hydrochloric acid is preferred because it has less influence on a roughened shape and has high smut removing performance. From the viewpoint of smut removing performance, the acid concentration of the acidic aqueous solution is preferably 0.3 to 35% by weight, more preferably 1 to 10% by weight. The washing method is not particularly limited, and examples thereof include a method in which an acidic aqueous solution is sprayed to a roughened copper layer surface and a method in which a roughened copper layer is dipped in an acidic aqueous solution. When the acidic aqueous solution is sprayed, it is preferred to perform washing at an acidic aqueous solution temperature of 15 to 35° C. and a spray pressure of 0.03 to 0.3 MPa for 3 to 30 seconds. When the copper layer is dipped, it is preferred to perform washing at an acidic aqueous solution temperature of 15 to 35° C. for 3 to 30 seconds.

When the microetching agent is continuously used, it is preferable to perform the roughening treatment while adding a replenishing liquid. The concentrations of the components in the microetching agent during the treatment can be properly maintained by performing the roughening treatment while adding the replenishing liquid into the microetching agent. The replenishing liquid is an aqueous solution containing an inorganic acid, a cupric ion source, a halide ion source, a sulfate ion source, and the aforementioned polymer. The adding amount of the replenishing liquid and the timing of adding the replenishing liquid can be appropriately set according to the concentration control range of each component or the like. The components in the replenishing liquid are similar to the components contained in the microetching agent described above. The concentrations of the components in the replenishing liquid are appropriately adjusted according to the initial concentration of the microetching agent to be used for treatment, or the like.

After the treatment with the microetching agent, a treatment with an aqueous solution of azoles or an alcohol solution may be performed in order to further improve adhesion to a resin. Further, after the treatment with the microetching agent of the present invention, an oxidation treatment called a brown oxide treatment or a black oxide treatment may be performed.

EXAMPLE

Examples of the present invention are described along with Comparative Examples. The present invention should not be construed to be limited to Examples below.

<Treatment with Microetching Agent>

A substrate having a rolled copper foil (HA foil manufactured by JX Nippon Mining & Metals Corporation) was used as a test board. The microetching agent (25° C.) shown in Table 1 was sprayed onto the copper foil of the above test board under the conditions with a spray pressure of 0.1 MPa, and etching was performed with the etching time adjusted such that an etching amount of the copper is set to 0.5 µm. Then, the test board was washed with water, and the etched surface was dipped in hydrochloric acid at a temperature of 25° C. (hydrogen chloride concentration: 3.5% by weight) for 15 seconds, and then washed with water and dried.

Another test board was prepared by forming 18 µm-thick copper plating on a glass fiber fabric epoxy resin-impregnated copper-clad laminate in which an electrolytic copper foil having a thickness of 35 µm had been laminated on both surfaces of an insulating substrate (manufactured by Hitachi Chemical Company, Ltd., trade name: MCL-E-67, 10 cm×10 cm, thickness of 0.2 mm). Using this test board, etching, acid pickling, washing with water, and drying were performed in the same manner as described above with use of the etching agents of Examples 1, 2, 11 and Comparative Examples 3, 4.

Details of the polymers A to E shown in Table 1 are as follows. These polymers were such that the polymer concentration in the etching agent would be the blending amount shown in Table 1. The balance of the blending components of each of the etching agents shown in Table 1 is ion-exchanged water.

Polymer A: alternating copolymer of diallyldialkylammonium (quaternary ammonium) and hydrochloride-sulfur dioxide having a repeating unit shown below and having a weight-average molecular weight of about 5000.

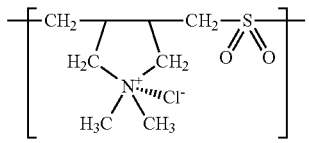

Polymer B: alternating copolymer of diallylamine (secondary amine) hydrochloride and sulfur dioxide having a repeating unit shown below and having a weight-average molecular weight of about 5000.

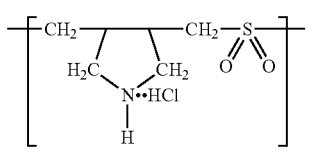

Polymer C: alternating copolymer of diallylamine (secondary amine) acetate and sulfur dioxide having a repeating unit shown below and having a weight-average molecular weight of about 5000

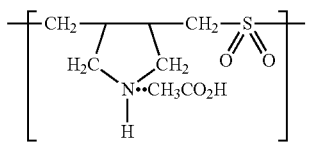

Polymer D: random copolymer of vinylpyrrolidone and N,N-dimethyl aminoethylmethacrylamide diethylsulfate having a structure shown below and weight-average molecular weight of about 800000.

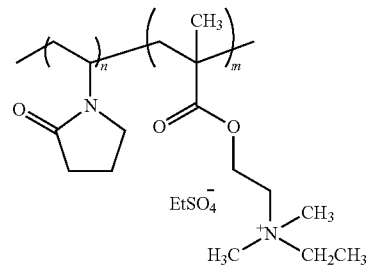

Polymer E: dicyandiamideformaldehyde condensation polymer having a structure shown below

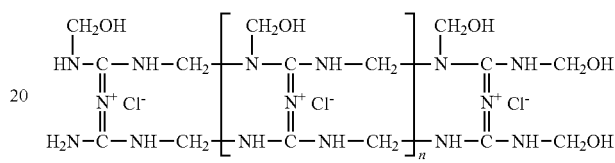

<Uniformity Evaluation of Roughening by Scanning Electron Microscope Observation>

Figure 1B:
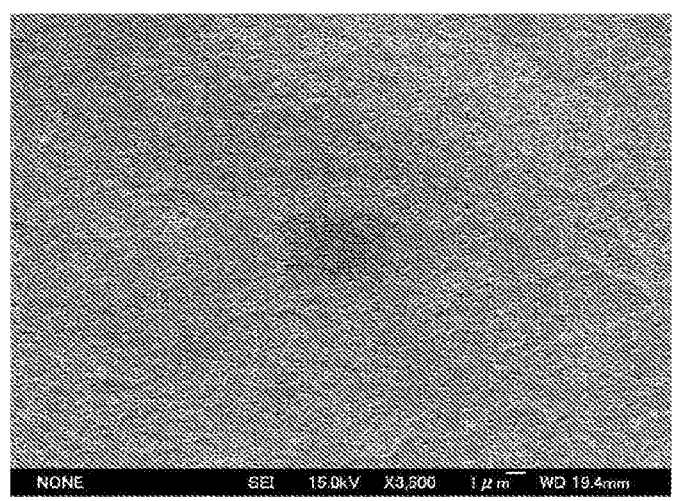
FIG. 1B is a scanning electron microscope photograph (photographing angle: 45°, magnification: 3500) of an electrolytic copper surface that has not been subjected to an etching treatment.

The surface of the copper layer of the test board subjected to the aforementioned treatment was observed with a scanning electron microscope (SEM) (Model: JSM-7000F, manufactured by JEOL Ltd.). The SEM observation images are shown in FIGS. 2 to 17. The correspondence between the Examples and Comparative Examples and the SEM observation images is shown in Table 1. In Table 1, the evaluation grades of the roughened shape of the rolled copper surface according to the following criteria are shown together. FIGS. 1A and 1B are the SEM observation images of rolled copper and electrolytic copper before the etching treatment, respectively.

<Evaluation Criteria>
1: irregularities are not formed on the surface
2: irregularities are formed on the surface but not roughened
3: irregularities are formed and the surface is roughened, but the irregularities are large and have in-plane unevenness
4: fine irregularities are formed on the entire surface
5: fine irregularities with excellent in-plane uniformity are formed on the entire surface

TABLE 1

Figure 2A:
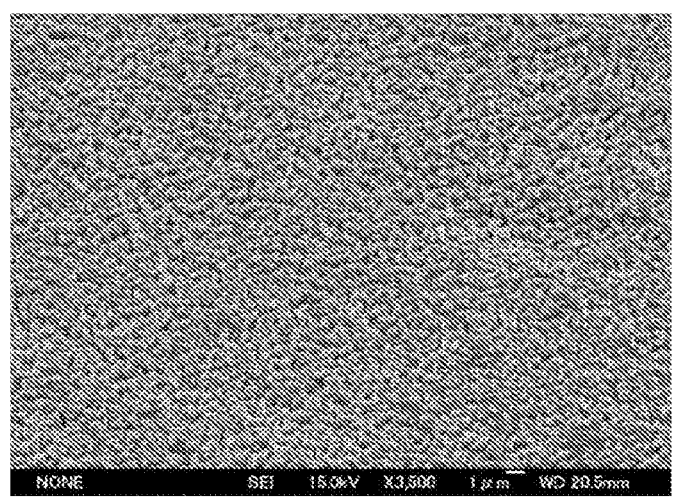
FIG. 2A is a scanning electron microscope photograph (photographing angle: 45°, magnification: 3500) of a rolled copper surface subjected to a roughening treatment with a microetching agent of an Example.
Figure 2B:
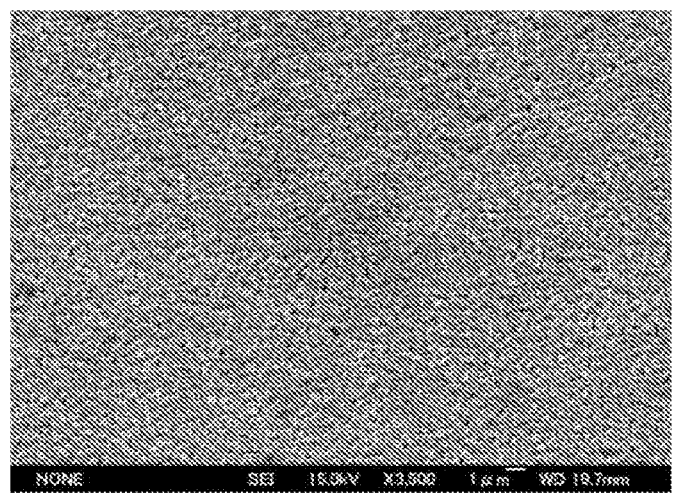
FIG. 2B is a scanning electron microscope photograph (photographing angle: 45°, magnification: 3500) of an electrolytic surface subjected to a roughening treatment with a microetching agent of an Example.
Figure 3A:
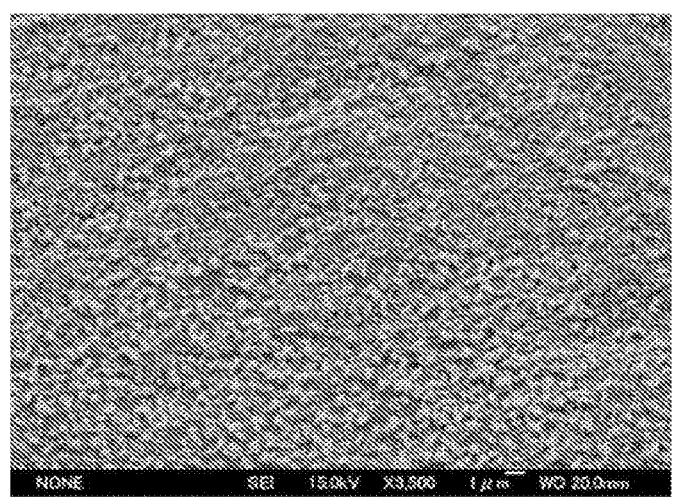
FIG. 3A is a scanning electron microscope photograph (photographing angle: 45°, magnification: 3500) of a rolled copper surface subjected to a roughening treatment with a microetching agent of an Example.
Figure 3B:
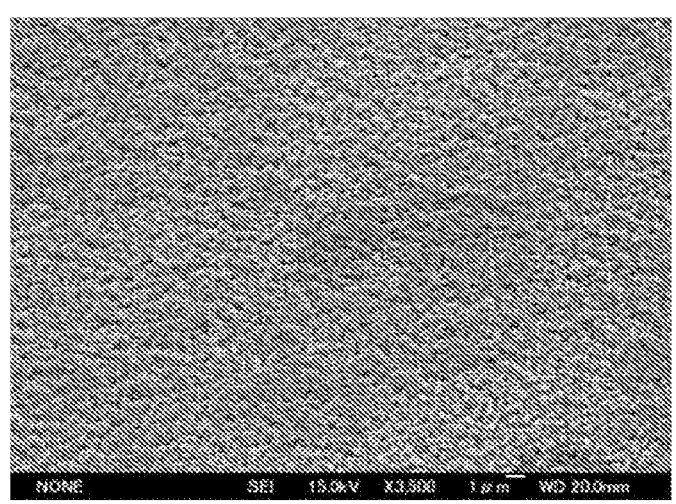
FIG. 3B is a scanning electron microscope photograph (photographing angle: 45°, magnification: 3500) of an electrolytic surface subjected to a roughening treatment with a microetching agent of an Example.
Figure 4:
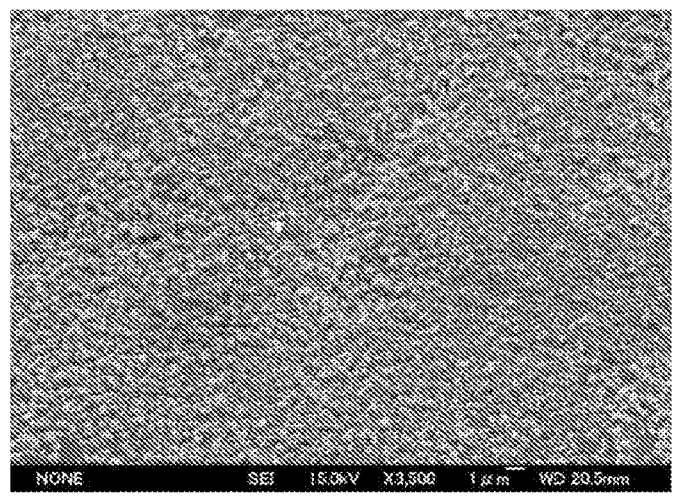
FIG. 4 is a scanning electron microscope photograph (photographing angle: 45°, magnification: 3500) of a rolled copper surface subjected to a roughening treatment with a microetching agent of an Example.
Figure 5:
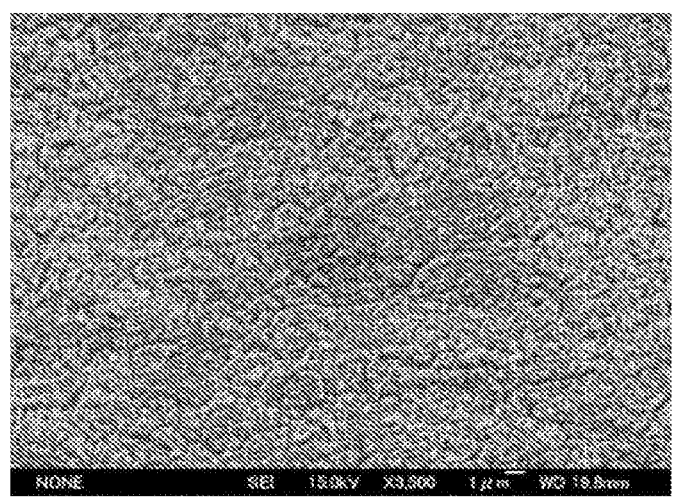
FIG. 5 is a scanning electron microscope photograph (photographing angle: 45°, magnification: 3500) of a rolled copper surface subjected to a roughening treatment with a microetching agent of an Example.
Figure 6:
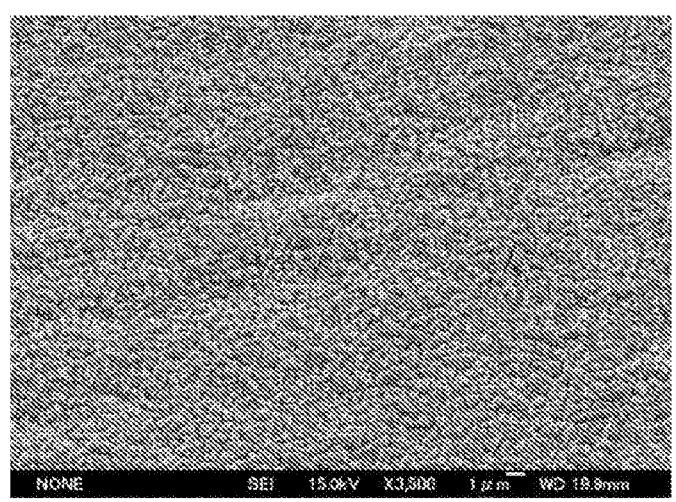
FIG. 6 is a scanning electron microscope photograph (photographing angle: 450, magnification: 3500) of a rolled copper surface subjected to a roughening treatment with a microetching agent of an Example.

| | Blending | | Ion concentration | | | Rolled copper etching | | Electrolytic |
|---|---|---|---|---|---|---|---|---|
| | Components | Blending amount (g/L) | Copper (mol/L) | Halogen (mol/L) | Sulfuric acid (mol/L) | Evaluation grade | SEM image | copper etching SEM image |
| Example 1 | 35% Hydrochloric acid<br>Cupric sulfate pentahydrate<br>Polymer A | 63<br>138<br>0.006 | 0.55 | 0.60 | 0.55 | 5 | FIG. 2A | FIG. 2B |
| Example 2 | 35% Hydrochloric acid<br>Cupric sulfate pentahydrate<br>Polymer A | 63<br>138<br>0.156 | 0.55 | 0.60 | 0.55 | 4 | FIG. 3A | FIG. 3B |
| Example 3 | 35% Hydrochloric acid<br>Cupric sulfate pentahydrate<br>Polymer A | 63<br>138<br>0.240 | 0.55 | 0.60 | 0.55 | 4 | FIG. 4 | |
| Example 4 | 35% Hydrochloric acid<br>Cupric sulfate pentahydrate<br>Polymer A | 38<br>82.8<br>0.031 | 0.33 | 0.36 | 0.33 | 5 | FIG. 5 | |
| Example 5 | 35% Hydrochloric acid<br>Cupric sulfate pentahydrate<br>Polymer A | 20<br>138<br>0.048 | 0.55 | 0.19 | 0.55 | 5 | FIG. 6 | |

TABLE 1-continued

Figure 7:
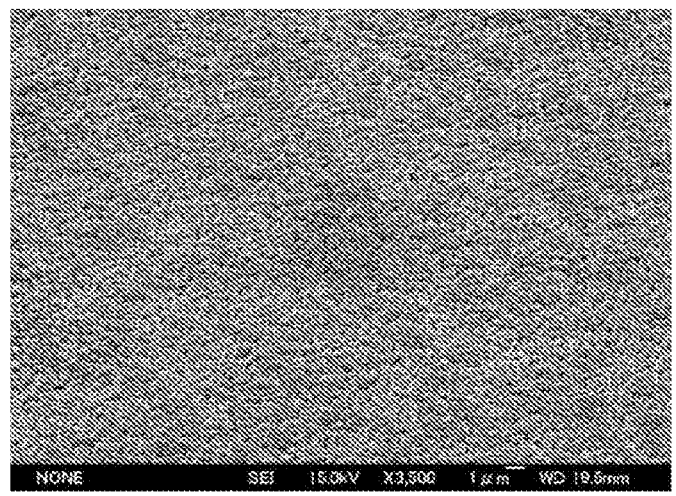
FIG. 7 is a scanning electron microscope photograph (photographing angle: 45°, magnification: 3500) of a rolled copper surface subjected to a roughening treatment with a microetching agent of an Example.
Figure 8:
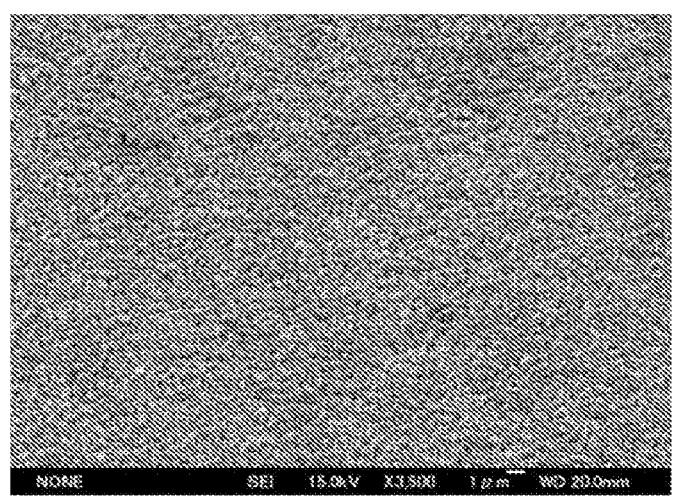
FIG. 8 is a scanning electron microscope photograph (photographing angle: 45°, magnification: 3500) of a rolled copper surface subjected to a roughening treatment with a microetching agent of an Example.
Figure 9:
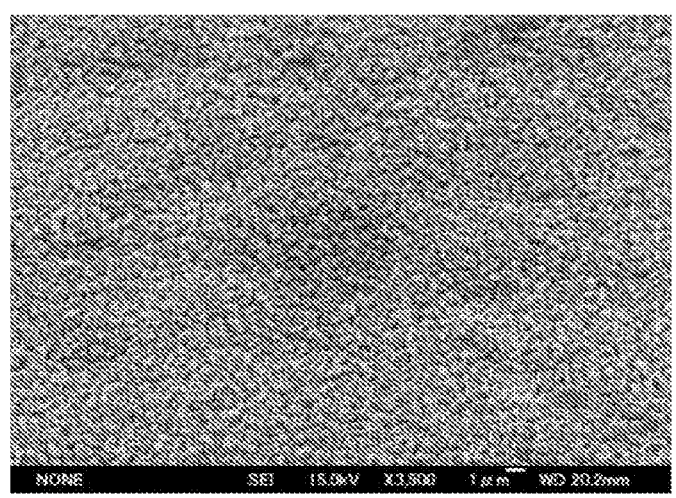
FIG. 9 is a scanning electron microscope photograph (photographing angle: 45°, magnification: 3500) of a rolled copper surface subjected to a roughening treatment with a microetching agent of an Example.
Figure 10:
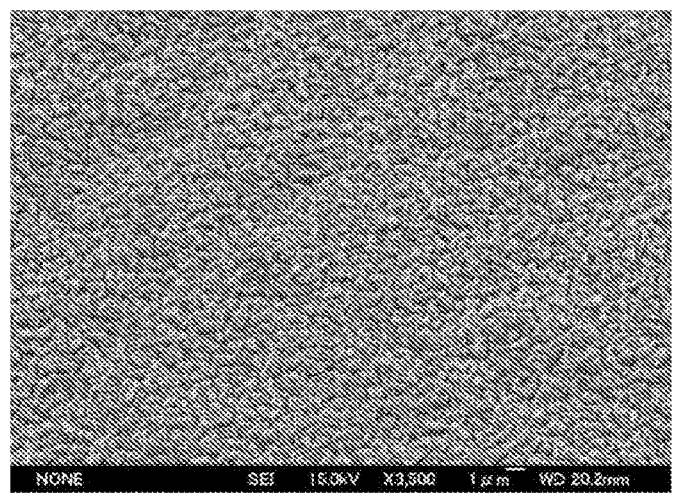
FIG. 10 is a scanning electron microscope photograph (photographing angle: 45°, magnification: 3500) of a rolled copper surface subjected to a roughening treatment with a microetching agent of an Example.
Figure 11:
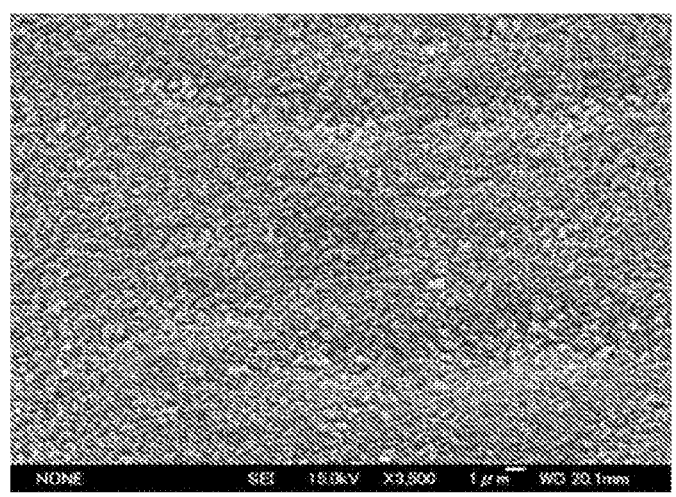
FIG. 11 is a scanning electron microscope photograph (photographing angle: 45°, magnification: 3500) of a rolled copper surface subjected to a roughening treatment with a microetching agent of an Example.
Figure 12A:
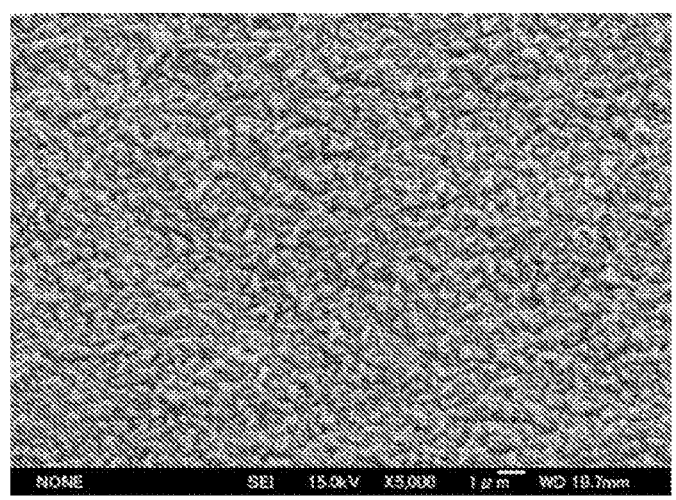
FIG. 12A is a scanning electron microscope photograph (photographing angle: 45°, magnification: 5000) of a rolled copper surface subjected to a roughening treatment with a microetching agent of an Example.
Figure 12B:
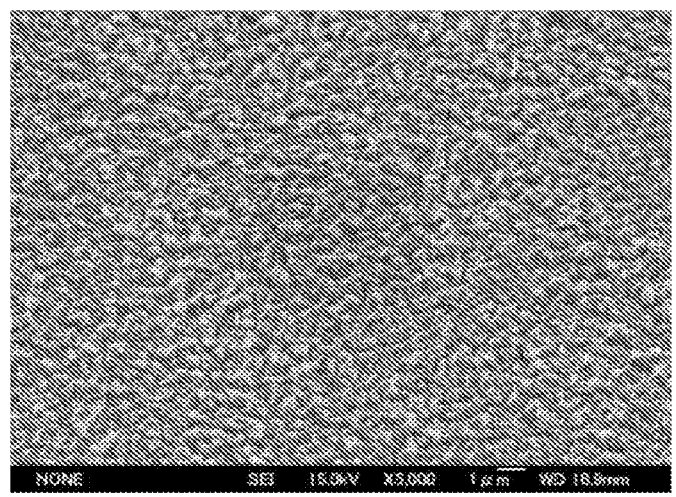
FIG. 12B is a scanning electron microscope photograph (photographing angle: 45°, magnification: 5000) of an electrolytic surface subjected to a roughening treatment with a microetching agent of an Example.
Figure 13A:
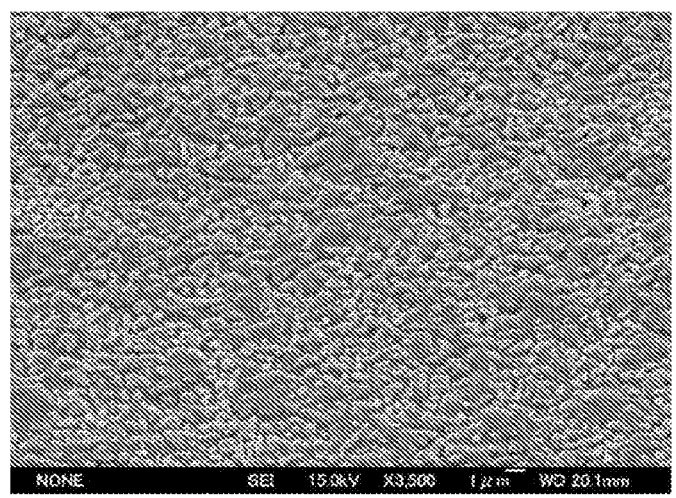
FIG. 13A is a scanning electron microscope photograph (photographing angle: 45°, magnification: 3500) of a rolled copper surface subjected to a roughening treatment with a microetching agent of a Comparative Example.
Figure 13B:
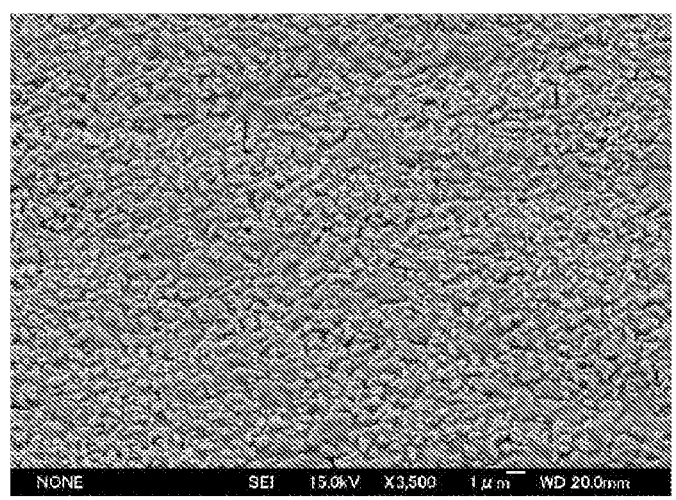
FIG. 13B is a scanning electron microscope photograph (photographing angle: 45°, magnification: 3500) of an electrolytic surface subjected to a roughening treatment with a microetching agent of a Comparative Example.
Figure 14A:
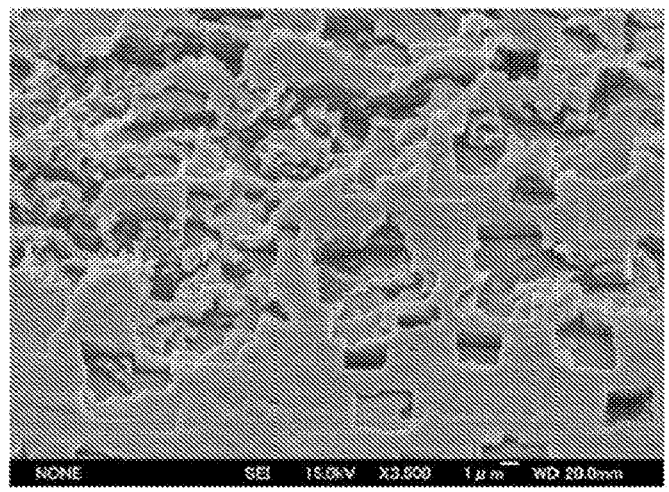
FIG. 14A is a scanning electron microscope photograph (photographing angle: 45°, magnification: 3500) of a rolled copper surface subjected to a roughening treatment with a microetching agent of a Comparative Example.
Figure 14B:
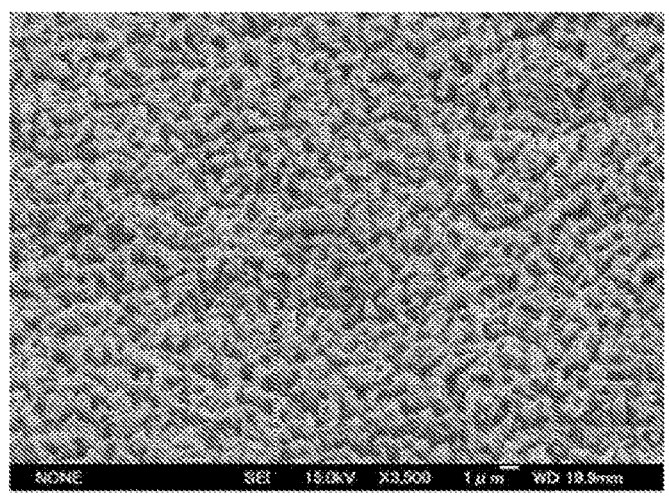
FIG. 14B is a scanning electron microscope photograph (photographing angle: 45°, magnification: 3500) of an electrolytic surface subjected to a roughening treatment with a microetching agent of a Comparative Example.
Figure 15A:
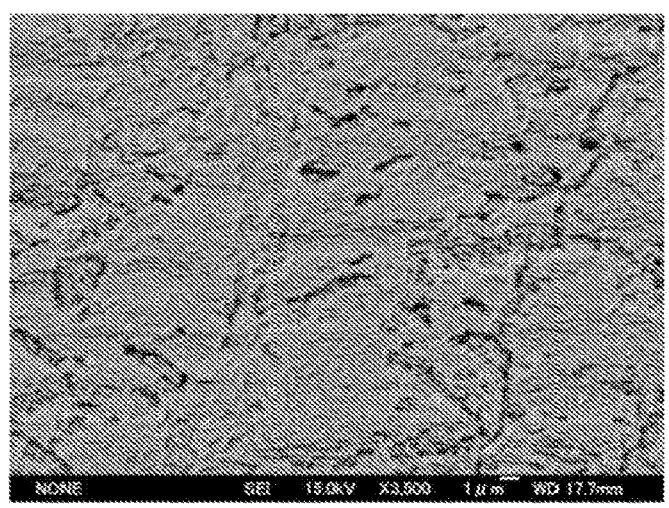
FIG. 15A is a scanning electron microscope photograph (photographing angle: 45°, magnification: 3500) of a rolled copper surface subjected to a roughening treatment with a microetching agent of a Comparative Example.
Figure 15B:
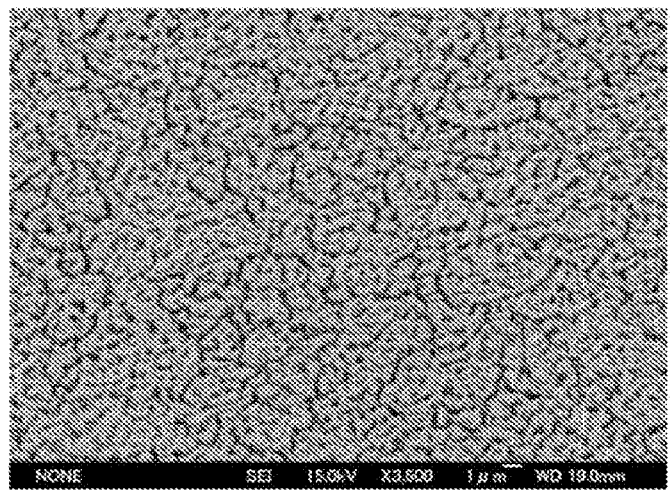
FIG. 15B is a scanning electron microscope photograph (photographing angle: 45°, magnification: 3500) of an electrolytic surface subjected to a roughening treatment with a microetching agent of a Comparative Example.
Figure 16:
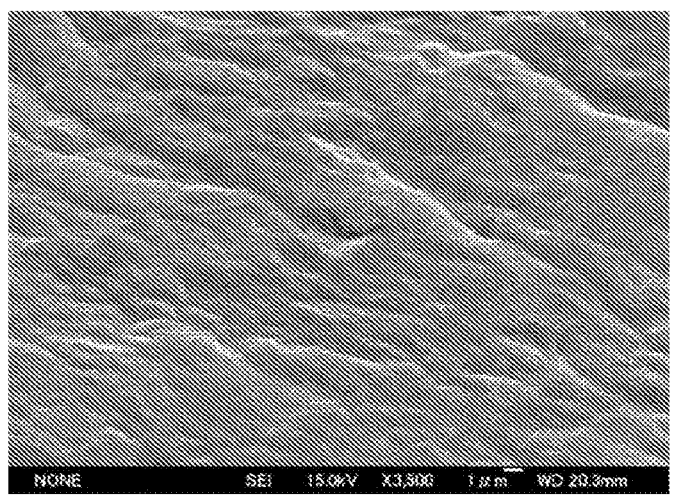
FIG. 16 is a scanning electron microscope photograph (photographing angle: 45°, magnification: 3500) of a rolled copper surface subjected to a roughening treatment with a microetching agent of a Comparative Example.
Figure 17:
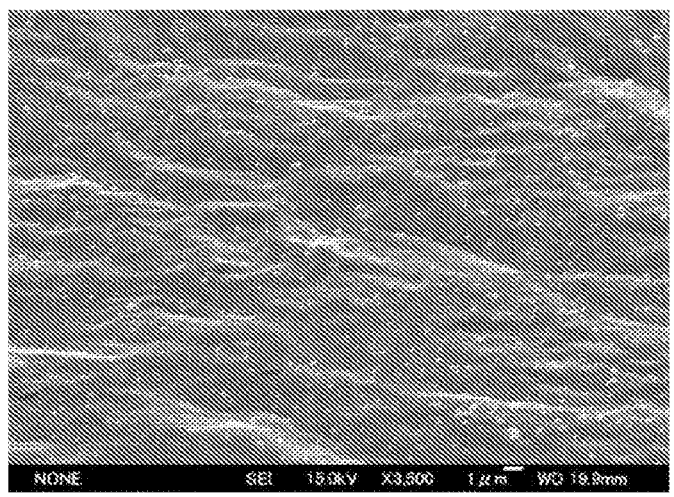
FIG. 17 is a scanning electron microscope photograph (photographing angle: 45°, magnification: 3500) of a rolled copper surface subjected to a roughening treatment with a microetching agent of a Comparative Example.

| | | Blending | Ion concentration | | | Rolled copper etching | | Electrolytic |
| | | Blending amount (g/L) | Copper (mol/L) | Halogen (mol/L) | Sulfuric acid (mol/L) | Evaluation grade | SEM image | copper etching SEM image |
| --- | --- | --- | --- | --- | --- | --- | --- | --- |
| Example 6 | 35% Hydrochloric acid<br>Cupric sulfate pentahydrate<br>Polymer A | 160<br>138<br>0.048 | 0.55 | 1.53 | 0.55 | 5 | FIG. 7 | |
| Example 7 | 35% Hydrochloric acid<br>Cupric sulfate pentahydrate<br>Polymer B | 63<br>138<br>0.120 | 0.55 | 0.60 | 0.55 | 5 | FIG. 8 | |
| Example 8 | 35% Hydrochloric acid<br>Cupric sulfate pentahydrate<br>Polymer C | 63<br>138<br>0.100 | 0.55 | 0.60 | 0.55 | 5 | FIG. 9 | |
| Example 9 | 35% Hydrochloric acid<br>Cupric sulfate pentahydrate<br>Polymer D | 63<br>138<br>0.040 | 0.55 | 0.60 | 0.55 | 5 | FIG. 10 | |
| Example 10 | 35% Hydrochloric acid<br>Cupric sulfate pentahydrate<br>Polymer E | 63<br>138<br>0.010 | 0.55 | 0.60 | 0.55 | 4 | FIG. 11 | |
| Example 11 | 62.5% Sulfuric acid<br>Cupric sulfate pentahydrate<br>Cupric chloride dihydrate<br>Polymer A | 50<br>85<br>36<br>0.048 | 0.55 | 0.42 | 0.66 | 5 | FIG. 12A | FIG. 12B |
| Comparative Example 1 | 35% Hydrochloric acid<br>Cupric sulfate pentahydrate | 63<br>138 | 0.55 | 0.60 | 0.55 | 2 | FIG. 13A | FIG. 13B |
| Comparative Example 2 | Acetic acid<br>Cupric chloride dihydrate<br>Ammonium acetate<br>Sodium chloride<br>Polymer D | 60<br>40<br>80<br>50<br>0.003 | 0.23 | 1.32 | 0.00 | 2 | FIG. 14A | FIG. 14B |
| Comparative Example 3 | 62.5% Sulfuric acid<br>35% Hydrogen peroxide<br>Cupric sulfate pentahydrate<br>NaOH<br>5-nitrobenzotriazole<br>Cresolsulfonic acid | 188<br>15<br>134<br>0.65<br>0.40<br>0.57 | 0.54 | 0.00 | 1.74 | 2 | FIG. 15A | FIG. 15B |
| Comparative Example 4 | 62.5% Sulfuric acid<br>35% Hydrogen peroxide<br>Cupric sulfate pentahydrate<br>Polymer A | 188<br>15<br>134<br>0.048 | 0.54 | 0.00 | 1.74 | 1 | FIG. 16 | |
| Comparative Example 5 | 62.5% Sulfuric acid<br>Cupric sulfate pentahydrate<br>Copper oxide<br>Polymer A | 47<br>63<br>24<br>0.048 | 0.55 | 0.00 | 0.55 | 1 | FIG. 17 | |

In Comparative Example 2 in which an organic acid-based microetching agent was used, a roughened shape was formed uniformly on the surface of electrolytic copper (FIG. 14B); however, the surface of rolled copper was not roughened (FIG. 14A). In Comparative Example 3 as well in which a sulfuric acid-hydrogen peroxide-based microetching agent was used, a roughened shape was formed uniformly on the surface of electrolytic copper (FIG. 15B); however, the surface of rolled copper was not roughened (FIG. 15A).

In contrast, in Example 1 in which a microetching agent containing hydrochloric acid, copper sulfate, and a polymer was used, a roughened shape excellent in adhesion to resin was formed uniformly on the surface of each of rolled copper (FIG. 2A) and electrolytic copper (FIG. 2B). In Example 2 as well, a roughened shape excellent in adhesion to resin was formed uniformly on the surfaces of both of rolled copper (FIG. 3A) and electrolytic copper (FIG. 3B). In Examples 3 to 6 as well in which the blending amount of hydrochloric acid, copper sulfate, and the polymer was changed, a roughened shaped was formed uniformly on the surface of rolled copper. In Example 11 as well in which a microetching agent containing sulfuric acid, copper sulfate, copper chloride, and a polymer was used, a roughened shape was formed uniformly on the surfaces of both of rolled copper (FIG. 12A) and electrolytic copper (FIG. 12B) in the same manner as in Examples 1, 2.

In Examples 7 to 10 as well in which the type of the polymer was changed, a roughened shaped was formed uniformly on the surface of rolled copper (FIGS. 8 to 11). In contrast, in Comparative Example 1 that did not contain a polymer, roughening unevenness was observed on the surface of rolled copper, and the roughened shape was nonuniform (FIG. 13A). In Comparative Examples 4 and 5, the surface of rolled copper was not roughened (FIGS. 16 and 17), despite that the microetching agent including the polymer A, which is identical to the polymer used in Examples 1 to 6 and 11, was used in each of these Comparative Examples.

[Comparative Examples Changing Polymer]

With use of an etching agent having a composition shown in Table 2, an etching treatment was performed on test boards having a rolled copper foil and on a test board having an electrolytic copper foil. The uniformity of roughening was evaluated by scanning electron microscope observation. The SEM observation images are shown in FIGS. 18 to 25. The correspondence between these Comparative Examples and the SEM observation images is shown in Table 2. Details of the polymers F to I shown in Table 2 are as follows.

Polymer F: poly(oxyethyleneoxypropylene(5E.O., 5P.O.))glycol monoether (number-average molecular weight of about 510)

Polymer G: polyethyleneimine (weight-average molecular weight of about 70000)

Polymer H: polyethyleneimine (weight-average molecular weight of about 300)

Polymer I: polyoxyethylene-polyoxypropylene block polymer adduct of ethylenediamine represented by the following formula

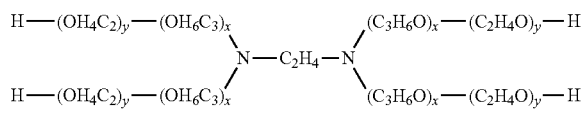

TABLE 2

Figure 18:
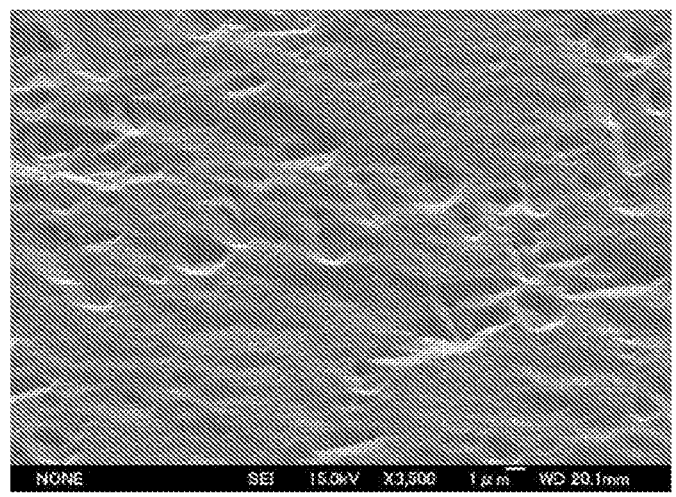
FIG. 18 is a scanning electron microscope photograph (photographing angle: 45°, magnification: 3500) of a rolled copper surface subjected to a roughening treatment with a microetching agent of a Comparative Example.
Figure 19A:
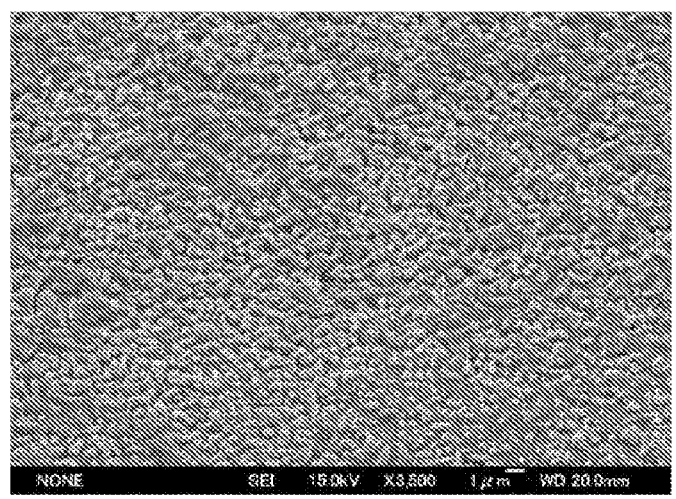
FIG. 19A is a scanning electron microscope photograph (photographing angle: 45°, magnification: 3500) of a rolled copper surface subjected to a roughening treatment with a microetching agent of a Comparative Example.
Figure 19B:
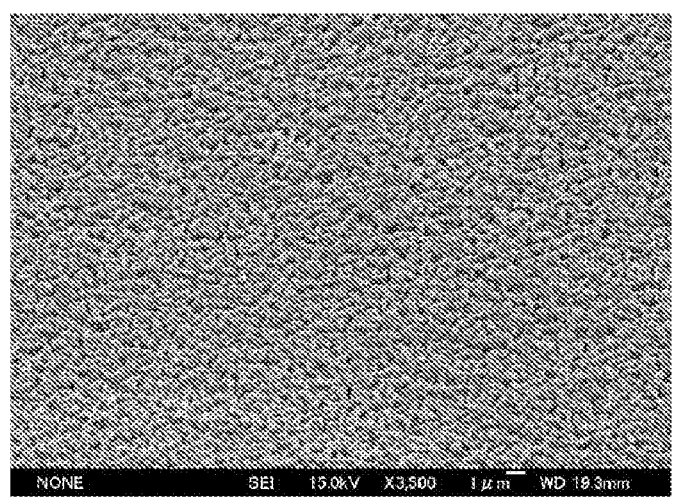
FIG. 19B is a scanning electron microscope photograph (photographing angle: 45°, magnification: 3500) of an electrolytic surface subjected to a roughening treatment with a microetching agent of a Comparative Example.
Figure 20A:
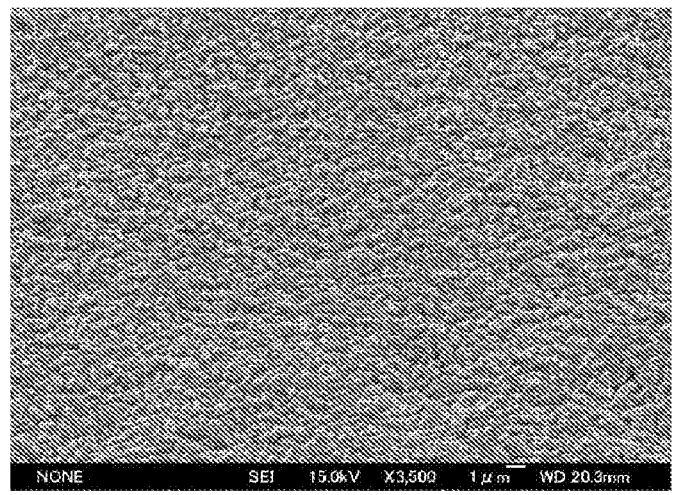
FIG. 20A is a scanning electron microscope photograph (photographing angle: 45°, magnification: 3500) of a rolled copper surface subjected to a roughening treatment with a microetching agent of a Comparative Example.
Figure 20B:
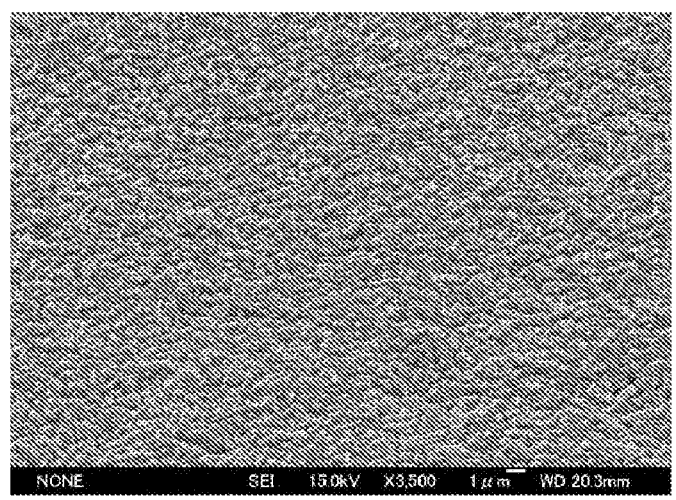
FIG. 20B is a scanning electron microscope photograph (photographing angle: 45°, magnification: 3500) of an electrolytic surface subjected to a roughening treatment with a microetching agent of a Comparative Example.
Figure 21A:
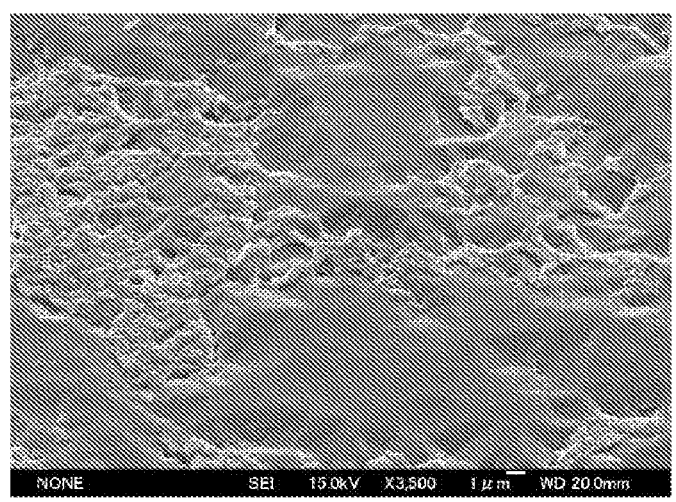
FIG. 21A is a scanning electron microscope photograph (photographing angle: 45°, magnification: 3500) of a rolled copper surface subjected to a roughening treatment with a microetching agent of a Comparative Example.
Figure 21B:
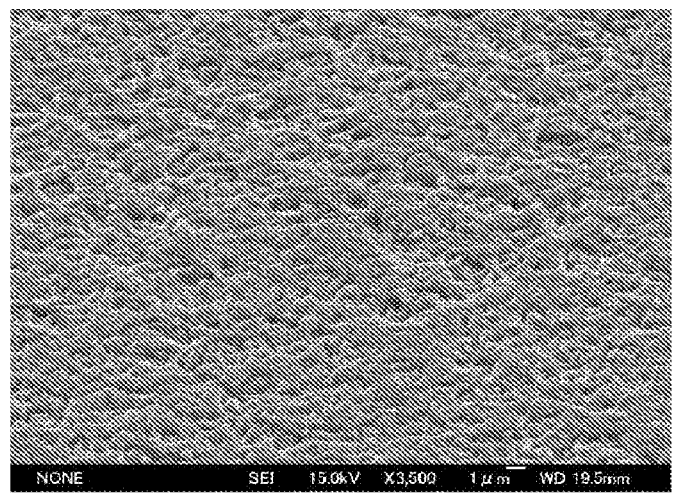
FIG. 21B is a scanning electron microscope photograph (photographing angle: 45°, magnification: 3500) of an electrolytic surface subjected to a roughening treatment with a microetching agent of a Comparative Example.
Figure 22A:
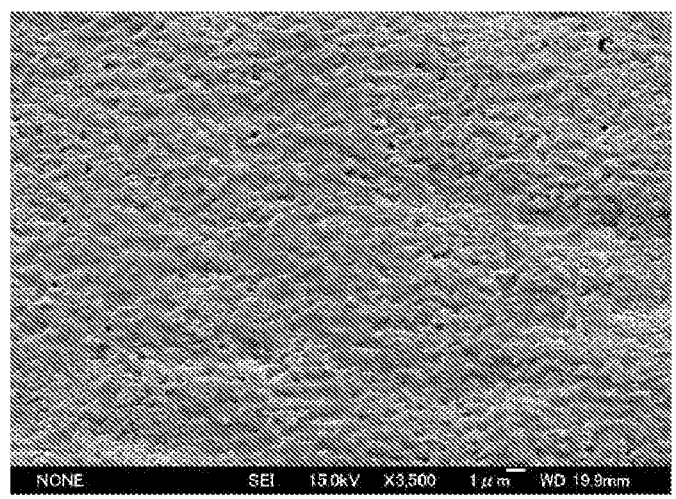
FIG. 22A is a scanning electron microscope photograph (photographing angle: 45°, magnification: 3500) of a rolled copper surface subjected to a roughening treatment with a microetching agent of a Comparative Example.
Figure 22B:
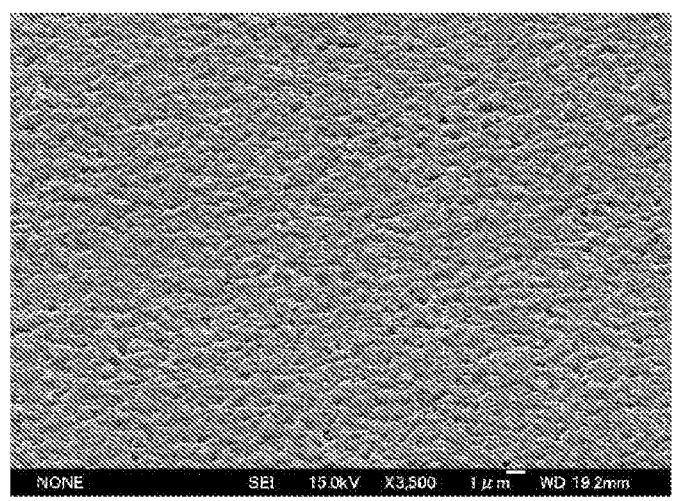
FIG. 22B is a scanning electron microscope photograph (photographing angle: 45°, magnification: 3500) of an electrolytic surface subjected to a roughening treatment with a microetching agent of a Comparative Example.
Figure 23A:
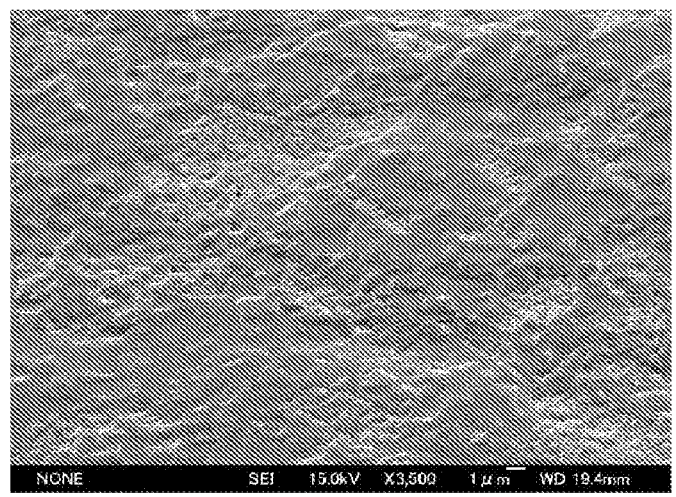
FIG. 23A is a scanning electron microscope photograph (photographing angle: 45°, magnification: 3500) of a rolled copper surface subjected to a roughening treatment with a microetching agent of a Comparative Example.
Figure 23B:
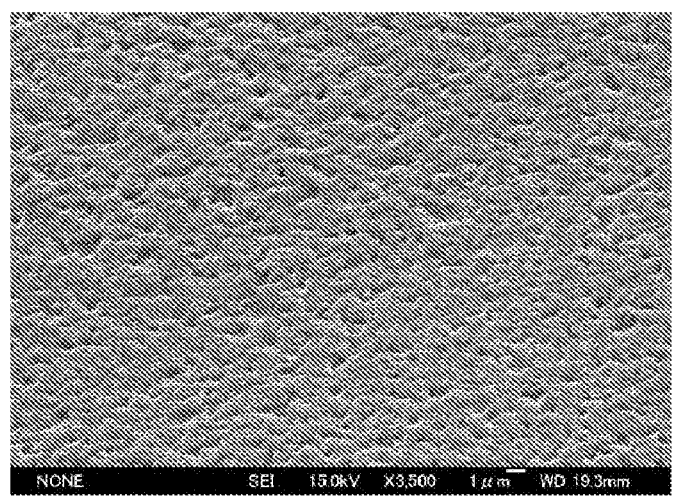
FIG. 23B is a scanning electron microscope photograph (photographing angle: 45°, magnification: 3500) of an electrolytic surface subjected to a roughening treatment with a microetching agent of a Comparative Example.
Figure 24A:
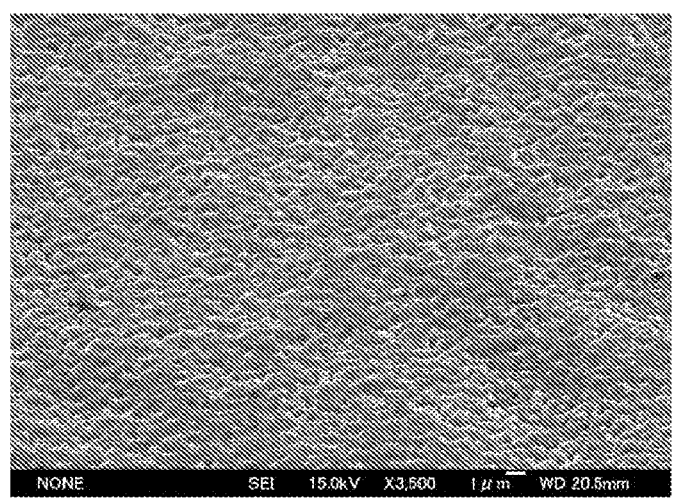
FIG. 24A is a scanning electron microscope photograph (photographing angle: 45°, magnification: 3500) of a rolled copper surface subjected to a roughening treatment with a microetching agent of a Comparative Example.
Figure 24B:
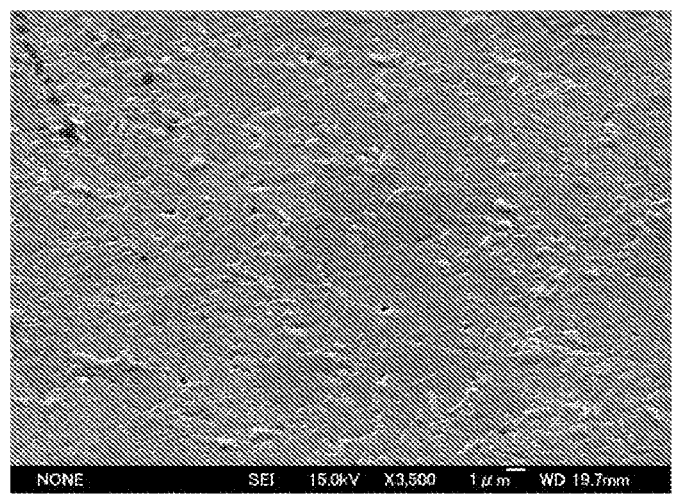
FIG. 24B is a scanning electron microscope photograph (photographing angle: 45°, magnification: 3500) of an electrolytic surface subjected to a roughening treatment with a microetching agent of a Comparative Example.
Figure 25A:
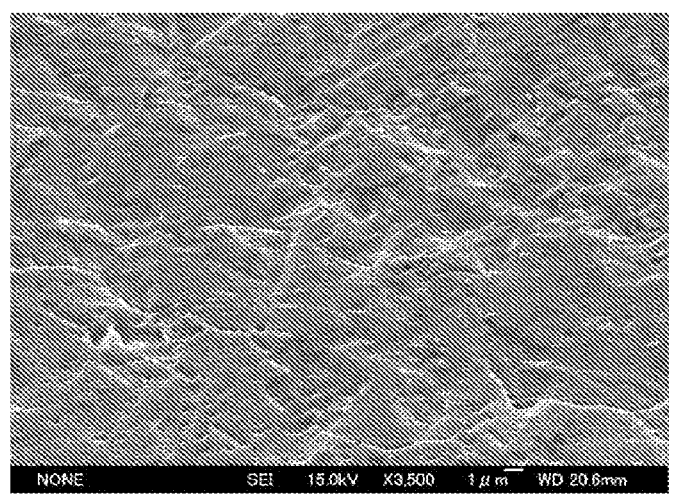
FIG. 25A is a scanning electron microscope photograph (photographing angle: 45°, magnification: 3500) of a rolled copper surface subjected to a roughening treatment with a microetching agent of a Comparative Example.
Figure 25B:
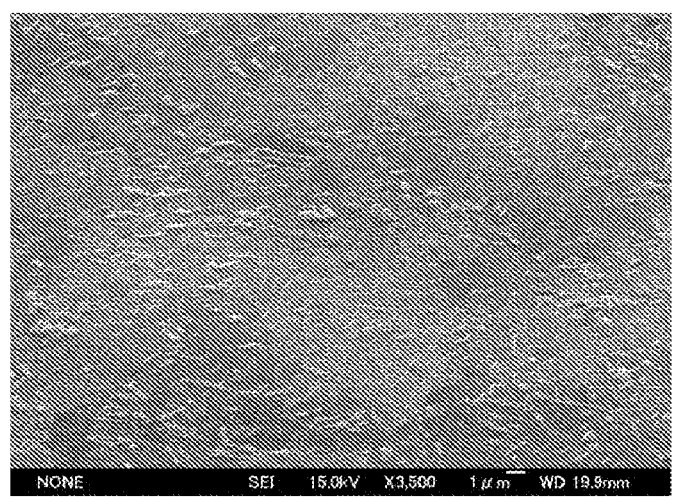
FIG. 25B is a scanning electron microscope photograph (photographing angle: 45°, magnification: 3500) of an electrolytic surface subjected to a roughening treatment with a microetching agent of a Comparative Example.

| Components | Blending<br>Blending<br>amount<br>(g/L) | Rolled copper<br>etching<br>Evaluation<br>grade | Rolled copper<br>etching<br>SEM<br>image | Electrolytic<br>copper<br>etching<br>SEM<br>image |
|---|---|---|---|---|
| Comparative Example 6 | 35% Hydrochloric acid | 63 | 1 | FIG. 18 | |
| | Cupric sulfate pentahydrate | 138 | | | |
| | Polymer F | 0.200 | | | |
| Comparative Example 7 | 35% Hydrochloric acid | 63 | 3 | FIG. 19A | FIG. 19B |
| | Cupric sulfate pentahydrate | 138 | | | |
| | Polymer G | 0.010 | | | |
| Comparative Example 8 | 35% Hydrochloric acid | 63 | 3 | FIG. 20A | FIG. 20B |
| | Cupric sulfate pentahydrate | 138 | | | |
| | Polymer G | 0.050 | | | |
| Comparative Example 9 | 35% Hydrochloric acid | 63 | 2 | FIG. 21A | FIG. 21B |
| | Cupric sulfate pentahydrate | 138 | | | |
| | Polymer G | 0.200 | | | |
| Comparative Example 10 | 35% Hydrochloric acid | 63 | 2 | FIG. 22A | FIG. 22B |
| | Cupric sulfate pentahydrate | 138 | | | |
| | Polymer H | 0.010 | | | |
| Comparative Example 11 | 35% Hydrochloric acid | 63 | 1 | FIG. 23A | FIG. 23B |
| | Cupric sulfate pentahydrate | 138 | | | |
| | Polymer H | 0.050 | | | |
| Comparative Example 12 | 35% Hydrochloric acid | 63 | 2 | FIG. 24A | FIG. 24B |
| | Cupric sulfate pentahydrate | 138 | | | |
| | Polymer I | 0.010 | | | |
| Comparative Example 13 | 62.5% Sulfuric acid | 47 | 1 | FIG. 25A | FIG. 25B |
| | Cupric sulfate pentahydrate | 63 | | | |
| | Polymer 1 | 0.500 | | | |

In Comparative Example 6 in which an etching agent containing a polymer (nonionic surfactant) having neither an amino group nor a quaternary ammonium group was used, a roughened shape was not formed on the surface of rolled copper (FIG. 18).

In each of Comparative Examples 7 and 8 in which an etching agent containing polyethyleneimine (polymer having a cationic amino group in a main chain) having a high molecular weight was used, the surface of rolled copper was roughened, but the irregularities were large and roughening unevenness was observed (FIGS. 19A and 20A). In Comparative Example 9 in which the polymer concentration had been raised to 0.2 g/L, irregularities were formed on the surface, but the surface was not roughened (FIG. 21A).

In each of Comparative Examples 10 to 12 in which an etching agent containing polyethyleneimine having a low molecular weight was used, at any polymer concentration, formed roughened shape was insufficient either on the surface of rolled copper (FIGS. 22A and 23A) or electrolytic copper (FIGS. 22B and 23B). From these results, it is apparent that a roughened shape excellent in adhesion to resin cannot be formed on the surface of rolled copper in the case in which, even though a polymer having an amino group is used, the polymer does not have an amino group in a side chain.

In each of Comparative Examples 12 and 13 in which an etching agent containing a polymer (nonionic surfactant) having a tertiary amino group in a main chain was used, a roughened shape was not formed either on the surface of rolled copper (FIGS. 24A and 25A) or on the surface of electrolytic copper (FIGS. 24B and 25B).

From the above results, it is apparent that an aqueous solution containing an inorganic acid, a cupric ion, a halide ion, a sulfate ion, and a polymer having a quaternary ammonium group or an amino group in a side chain can specifically form fine irregularities uniformly on the surface of rolled copper as well as electrolytic copper.

The invention claimed is:

1. A microetching agent for copper that is capable of roughening a copper surface,
wherein the microetching agent is an acidic aqueous solution comprising: an inorganic acid; a cupric ion source; a halide ion source; a sulfate ion source; and a polymer,
wherein the polymer is a water-soluble polymer having a weight-average molecular weight of 1000 or more, and having a first repeating unit comprising a cationic amino group and a second repeating unit comprising a sulfur dioxide group.

2. The microetching agent according to claim 1, wherein the cationic amino group is a quaternary ammonium group.

3. The microetching agent according to claim 1, wherein the first repeating unit is represented by the following formula (II):

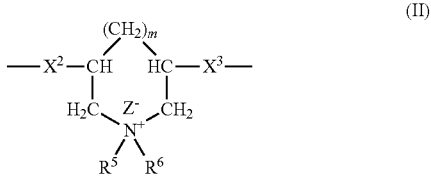

wherein in the formula (II), each of $R^5$ and $R^6$ is a chain or cyclic hydrocarbon group optionally having a substituent, where $R^5$ and $R^6$ may be bonded with each other to form a cyclic structure; m in an integer of 0 to 2; $X^2$ and $X^3$ are each independently a single bond or a divalent linking group; and $Z^-$ is a counter anion.

4. The microetching agent according to claim 1, wherein a molar concentration of the cupric ion source is 0.05 mol/L or more.

5. The microetching agent according to claim 1, wherein a molar concentration of the halide ion source is 0.01 to 4 mol/L.

6. The microetching agent according to claim 1, wherein a molar concentration of the cupric ion source is 0.2 times or more as large as a molar concentration of the halide ion source.

7. The microetching agent according to claim 1, wherein a molar concentration of the sulfate ion source is 0.02 mol/L or more.

8. The microetching agent according to claim 1, wherein the inorganic acid is at least one acid selected from the group consisting of sulfuric acid and a hydrohalic acid.

9. The microetching agent according to claim 1, wherein a concentration of the polymer is 0.002 to 1 g/L.

10. A method for producing a wiring board containing a copper layer,
the method comprising roughening the copper layer by bringing a microetching agent into contact with a surface of the copper layer,
wherein the microetching agent is an acidic aqueous solution comprising: an inorganic acid; a cupric ion source; a halide ion source; a sulfate ion source; and a polymer,
wherein the polymer is a water-soluble polymer having a weight-average molecular weight of 1000 or more, and having a first repeating unit comprising a cationic amino group and a second repeating unit comprising a sulfur dioxide group.

11. The method according to claim 10, wherein the cationic amino group is a quaternary ammonium group.

12. The method according to claim 10, wherein the first repeating unit is represented by the following formula (II):

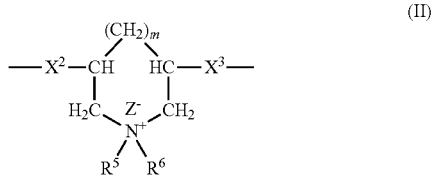

wherein in the formula (II), each of $R^5$ and $R^6$ is a chain or cyclic hydrocarbon group optionally having a substituent, where $R^5$ and $R^6$ may be bonded with each other to form a cyclic structure; m in an integer of 0 to 2; $X^2$ and $X^3$ are each independently a single bond or a divalent linking group; and $Z^-$ is a counter anion.

13. The method according to claim 10, wherein the surface of the copper layer that is brought into contact with the microetching agent is rolled copper.

14. The method according to claim 10, wherein
a replenishing liquid is added into the microetching agent during the roughening the copper layer, the replenishing liquid is an acidic aqueous solution comprising an inorganic acid, a halide ion source, and a polymer, and
the polymer in the replenishing liquid is a water-soluble polymer having a weight-average molecular weight of 1000 or more, and having a first repeating unit comprising a cationic amino group and a second repeating unit comprising a sulfur dioxide group.

15. The method according to claim 10, wherein a molar concentration of the cupric ion source in the microetching agent is 0.05 mol/L or more.

16. The method according to claim 10, wherein a molar concentration of the halide ion source in the microetching agent is 0.01 to 4 mol/L.

17. The method according to claim 10, wherein a molar concentration of the cupric ion source is 0.2 times or more as large as a molar concentration of the halide ion source in the microetching agent.

18. The method according to claim 10, wherein a molar concentration of the sulfate ion source in the microetching agent is 0.02 mol/L or more.

19. The method according to claim 10, wherein the inorganic acid in the microetching agent is at least one acid selected from the group consisting of sulfuric acid and a hydrohalic acid.

20. The method according to claim 10, wherein a concentration of the polymer in the microetching agent is 0.002 to 1 g/L.

* * * * *